United States Patent
Tazabekov

(10) Patent No.: US 12,456,963 B2
(45) Date of Patent: Oct. 28, 2025

(54) BANDPASS FILTER HAVING AN ADDITIONAL SHUNT RESONATOR CIRCUIT

(71) Applicant: Skyworks Solutions, Inc., Irvine, CA (US)

(72) Inventor: Olzhas Tazabekov, Toronto (CA)

(73) Assignee: Skyworks Solutions, Inc., Irvine, CA (US)

( * ) Notice: Subject to any disclaimer, the term of this patent is extended or adjusted under 35 U.S.C. 154(b) by 304 days.

(21) Appl. No.: 18/124,143

(22) Filed: Mar. 21, 2023

(65) Prior Publication Data
US 2023/0327646 A1 Oct. 12, 2023

Related U.S. Application Data

(60) Provisional application No. 63/328,906, filed on Apr. 8, 2022.

(51) Int. Cl.
| | |
|---|---|
| *H03H 9/54* | (2006.01) |
| *H03H 9/205* | (2006.01) |
| *H03H 9/25* | (2006.01) |
| *H03H 9/56* | (2006.01) |
| *H03H 9/64* | (2006.01) |

(52) U.S. Cl.
CPC ............ *H03H 9/542* (2013.01); *H03H 9/205* (2013.01); *H03H 9/25* (2013.01); *H03H 9/568* (2013.01); *H03H 9/6483* (2013.01)

(58) Field of Classification Search
CPC .......... H03H 9/542; H03H 9/205; H03H 9/25; H03H 9/568; H03H 9/6483; H03H 9/605
USPC .......................... 333/133, 187, 188, 193–196
See application file for complete search history.

(56) References Cited

U.S. PATENT DOCUMENTS

| | | |
|---|---|---|
| 6,166,611 A | 12/2000 | Seki et al. |
| 6,734,729 B1 | 5/2004 | Andrys et al. |
| 6,768,382 B1 | 7/2004 | Shie et al. |
| 6,784,748 B1 | 8/2004 | Canyon et al. |
| 7,288,991 B2 | 10/2007 | Ripley |
| 7,408,413 B2 | 8/2008 | Ripley |
| 7,937,049 B2 | 5/2011 | Phillips et al. |
| 8,154,345 B2 | 4/2012 | Andrys et al. |
| 8,362,840 B2 | 1/2013 | Andrys et al. |
| 8,369,803 B2 | 2/2013 | Phillips et al. |
| 9,065,385 B2 | 6/2015 | Gorbachov |
| 9,154,114 B2 | 10/2015 | Ikeuchi |
| 9,595,926 B2 | 3/2017 | Quaglietta |
| 9,698,739 B2 | 7/2017 | Young et al. |

(Continued)

*Primary Examiner* — Jorge L Salazar, Jr.
(74) *Attorney, Agent, or Firm* — Knobbe, Martens, Olson & Bear, LLP

(57) ABSTRACT

A bandpass filter is provided, comprising a series resonator circuit disposed between an input and an output of the bandpass filter; a first shunt resonator circuit connected to ground in parallel with the series resonator circuit; and a second shunt resonator circuit connected to ground in parallel with the series resonator circuit, the second shunt resonator circuit configured to have one or more frequency pairs comprising an antiresonant frequency and a first resonant frequency, wherein for each frequency pair the antiresonant frequency is within a passband of the bandpass filter and the first resonant frequency at a higher frequency than the antiresonant frequency. A radiofrequency module and a wireless device comprising the same are also provided.

20 Claims, 12 Drawing Sheets

(56) References Cited

U.S. PATENT DOCUMENTS

| | | |
|---|---|---|
| 9,698,853 B2 | 7/2017 | Andrys et al. |
| 9,722,574 B2 | 8/2017 | Ikeuchi |
| 9,853,613 B2 | 12/2017 | Quaglietta |
| 10,122,331 B2 | 11/2018 | Young et al. |
| 10,374,556 B2 | 8/2019 | Lam et al. |
| 10,951,178 B2 | 3/2021 | Ripley et al. |
| 11,601,112 B2 | 3/2023 | Wang et al. |
| 11,646,701 B2 | 5/2023 | Ripley et al. |
| 2019/0181812 A1 | 6/2019 | Young et al. |
| 2020/0119716 A1* | 4/2020 | Kim ............... H03H 9/568 |
| 2023/0136934 A1 | 5/2023 | Shin et al. |
| 2023/0327609 A1 | 10/2023 | Gebeyehu |
| 2023/0378917 A1 | 11/2023 | Kundur et al. |

* cited by examiner

BANDPASS FILTER HAVING AN ADDITIONAL SHUNT RESONATOR CIRCUIT

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Field

Embodiments of the invention relate to a bandpass filter. In particular, embodiments relate to a bandpass filter having a second shunt resonator circuit having an antiresonant frequency within a passband of the bandpass filter and a resonant frequency at a higher frequency than the antiresonant frequency. Embodiments also relate to radiofrequency modules and wireless devices comprising the same.

Description of the Related Technology

Bandpass filters allow a certain range of frequencies through (the passband) while attenuating other frequencies. In this manner, they can filter out out-of-band signals or noise, amongst other uses. They typically comprise a series resonator, so called because it is located in series between an input and an output of the bandpass filter, and a shunt resonator, connected between one side of the series resonator and ground. However, this construction only allows for bandpass filters having a certain passband width to be provided. Making bandpass filters having a large passband (e.g., wideband filters) presents a challenge.

SUMMARY

According to one embodiment there is provided a bandpass filter comprising: a series resonator circuit disposed between an input and an output of the bandpass filter; a first shunt resonator circuit connected to ground in parallel with the series resonator circuit; and a second shunt resonator circuit connected to ground in parallel with the series resonator circuit, the second shunt resonator circuit configured to have one or more frequency pairs comprising an antiresonant frequency and a first resonant frequency, wherein for each frequency pair the antiresonant frequency is within a passband of the bandpass filter and the first resonant frequency at a higher frequency than the antiresonant frequency.

In one example, the passband of the bandpass filter is defined between a resonant frequency of the first shunt resonator circuit and an antiresonant frequency of the series resonator circuit.

In one example, one of more of the first resonant frequencies of the second shunt resonator circuit is at a substantially similar frequency to a high frequency cut-off of the passband.

In one example, the one or more first resonant frequencies of the second shunt resonator circuit at a substantially similar frequency to a high frequency cut-off of the passband are at a slightly higher or a slightly lower frequency than the antiresonant frequency of the series resonator circuit such that the width of an attenuation region at the high frequency cut-off is increased.

In one example, the second shunt resonator circuit is further configured to have one or more second resonant frequencies, each of the one or more second resonant frequencies corresponding to one of the frequency pairs and at a lower frequency than the antiresonant frequency of the corresponding frequency pair, and wherein one or more of the second resonant frequencies are at a much lower frequency than a low frequency cut-off of the passband.

In one example, the second shunt resonator circuit is further configured to have one or more second resonant frequencies, each of the one or more second resonant frequencies corresponding to one of the frequency pairs and at a lower frequency than the antiresonant frequency of the corresponding frequency pair, and wherein one or more of the second resonant frequencies are at a substantially similar frequency to the low frequency cut-off of the passband.

In one example, the one or more second resonant frequencies of the second shunt resonator circuit at a substantially similar frequency to a low frequency cut-off of the passband are at a slightly higher or a slightly lower frequency than the resonant frequency of the first shunt resonator circuit such that the width of an attenuation region at the low frequency cut-off is increased.

In one example, one or more of the antiresonant frequencies of the second shunt resonator circuit are higher than a resonant frequency of the series resonator circuit.

In one example, one or more of the antiresonant frequencies of the second shunt resonator circuit are lower than a resonant frequency of the series resonator circuit.

In one example, the second shunt resonator circuit comprises one or more resonators and one or more reactive components, each of the one or more resonators corresponding to one of the frequency pairs.

In one example, the one or more reactive components comprise an inductor in series with the one or more resonators.

In one example, the inductor has a large inductance value such that for each frequency pair of the second shunt resonator circuit the antiresonant frequency is within the passband of the bandpass filter and the first resonant frequency is at a higher frequency than the antiresonant frequency.

In one example, the one or more reactive components comprise a capacitor in parallel with the one or more resonators.

In one example, the capacitance of the capacitor is higher than the capacitance of the one or more resonators.

In one example, the series resonator circuit comprises a plurality of resonators in series, in parallel, or both.

In one example, the first shunt resonator circuit comprises a plurality of resonators in series, in parallel, or both.

In one example, any or all of the series resonator circuit, the first shunt resonator circuit, and the second shunt resonator circuit comprise bulk acoustic wave resonators.

In one example, any or all of the series resonator circuit, the first shunt resonator circuit, and the second shunt resonator circuit comprise surface acoustic wave resonators.

According to another embodiment there is provided a radiofrequency module comprising a bandpass filter, the bandpass filter having a series resonator circuit disposed between an input and an output of the bandpass filter; a first shunt resonator circuit connected to ground in parallel with the series resonator circuit; and a second shunt resonator circuit connected to ground in parallel with the series resonator circuit, the second shunt resonator circuit configured to have one or more antiresonant frequency and first resonant frequency pairs, wherein for each frequency pair the antiresonant frequency is within a passband of the bandpass filter and the first resonant frequency at a higher frequency than the antiresonant frequency.

According to another embodiment there is provided a wireless device comprising a bandpass filter, the bandpass filter having a series resonator circuit disposed between an input and an output of the bandpass filter; a first shunt resonator circuit connected to ground in parallel with the series resonator circuit; and a second shunt resonator circuit connected to ground in parallel with the series resonator circuit, the second shunt resonator circuit configured to have one or more antiresonant frequency and first resonant frequency pairs, wherein for each frequency pair the antiresonant frequency is within a passband of the bandpass filter and the first resonant frequency at a higher frequency than the antiresonant frequency.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to bandpass filters having increased passband widths and/or increased attenuation region widths.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
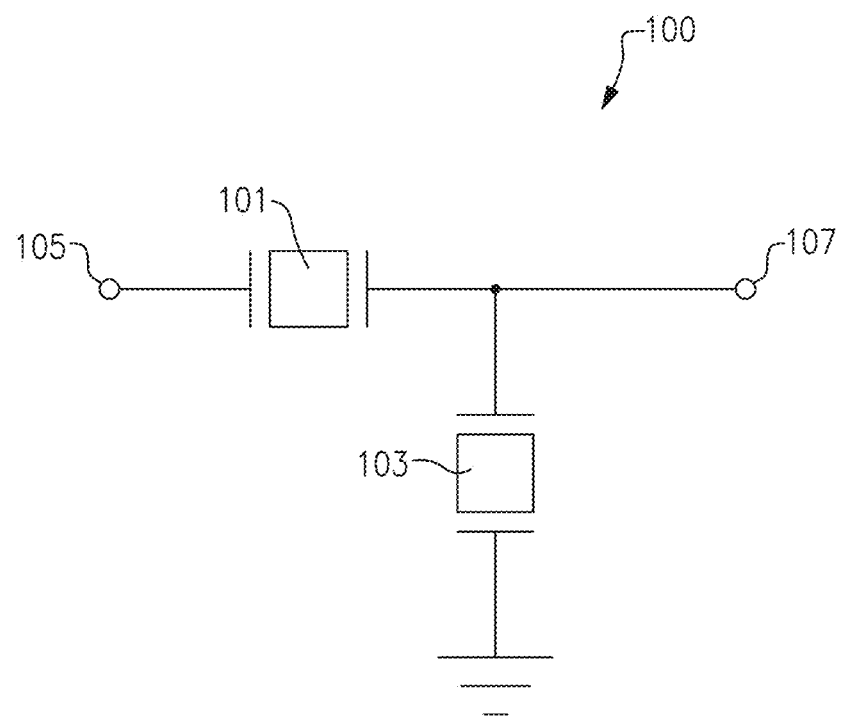
FIG. 1 is a diagram of an bandpass filter according to an embodiment.

FIG. 1 illustrates a bandpass filter 100. The bandpass filter 100 comprises a series resonator 101 connected between an input 105 and an output 107. The bandpass filter 100 also comprises a shunt resonator 103 connected in parallel with ground. That is, the shunt resonator 103 is connected from between the input 105 and output 107 to ground.

Figure 2:
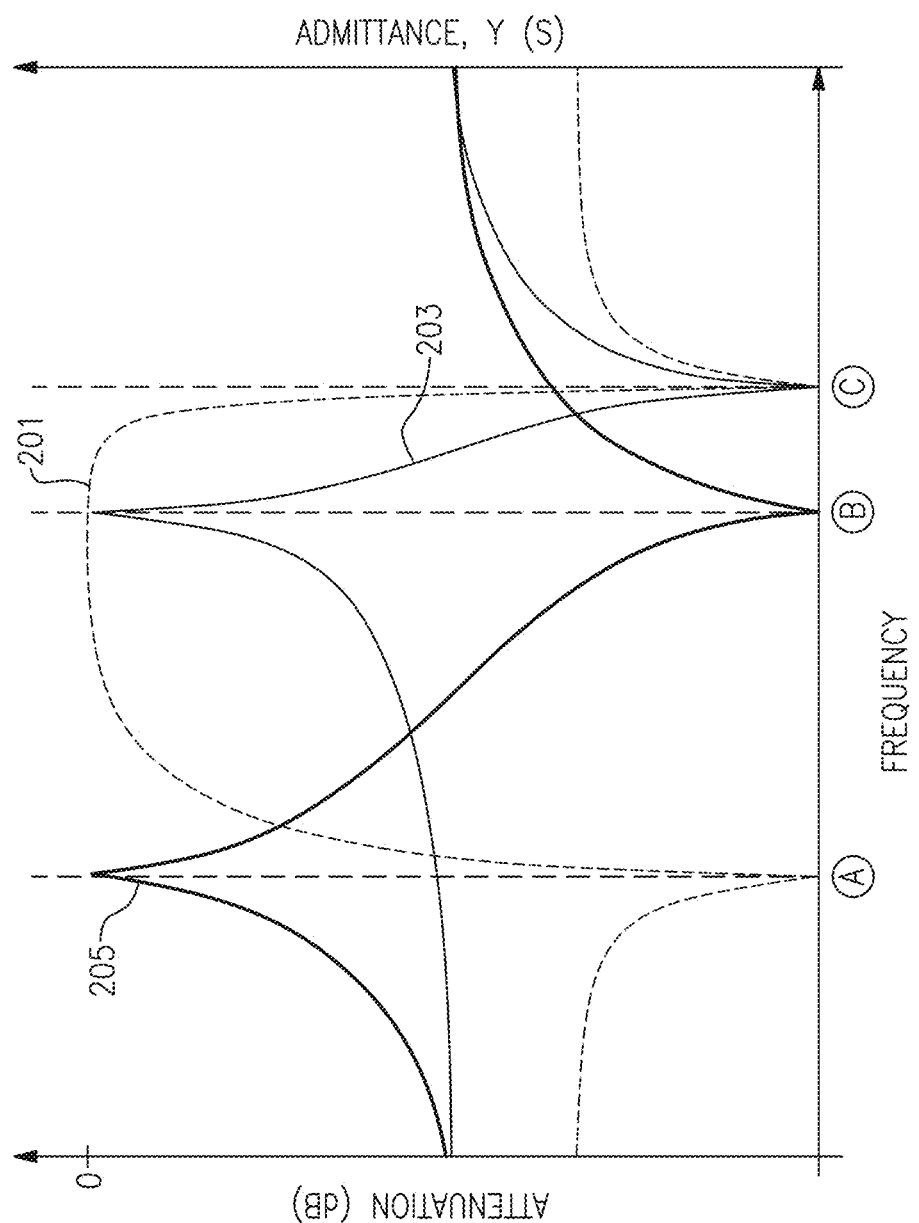
FIG. 2 is a frequency response of a bandpass filter according to an embodiment.

FIG. 2 shows the frequency response of the bandpass filter 100 of FIG. 1 and its constituent components. Dashed line 201 shows the frequency response of the bandpass filter 100, while the thin line 203 shows the frequency response of the series resonator 101 and the thick line 205 shows the frequency response of the shunt resonator 103. It will be noted that the frequency response of the bandpass filter 100 is shown by the attenuation in dB on the left axis while the frequency responses of the series resonator 101 and the shunt resonator 103 are shown by the admittance Y in S on the right axis. Therefore, high values of line 201 corresponding to the bandpass filter correspond to little or no attenuation of a signal passing through the bandpass filter while low values correspond to larger amounts of attenuation, and high values of lines 203, 205 corresponding to the resonators 101, 103 correspond to a signal being able to pass through the resonators while low values correspond to signals not being able to pass through the resonator.

Considering the frequency response of shunt resonator 103, represented by line 205, at low frequencies the admittance increases until a resonant frequency at A, where the admittance of the shunt resonator 103 is at a maximum. This resonant frequency is often referred to as series resonance, or $f_s$. Increasing the frequency beyond this resonant frequency causes the admittance of the shunt resonator 103 to then decrease to a minimum at an antiresonant frequency at B. This antiresonance is often referred to as parallel resonance, or $f_p$. From the antiresonant frequency, the admittance then rises again as frequency is further increased.

The frequency response of the shunt resonator 103 (line 205) gives the bandpass filter 100 the lower edge of the passband (from A) and the low frequency attenuation zone (at A). This is because at the resonant frequency of the shunt resonator 103 at A, the shunt resonator 103 has a large admittance and so a signal passing through the bandpass filter 100 is grounded, meaning that no signal, or only a heavily attenuated signal, reaches the output 107 when passing through the bandpass filter 100. This gives rise to the attenuation region at A.

Next, considering the frequency response of the series resonator 101 (line 203), it can be seen that the admittance increases as frequency increases up to a resonant frequency at B, after which the admittance quickly decreases to an antiresonant frequency at C, before increasing once more as frequency increases further. This frequency response helps give rise to the high frequency cut-off of the passband (between B and C) and the high frequency attenuation region (at C). At B, because the series resonator 101 here has a very high admittance at its resonant frequency, signals can pass through it with no, or very little, attenuation. Additionally, in this case the resonant frequency of the series resonator 101 matches the antiresonant frequency of the shunt resonator 103. Accordingly, the shunt resonator 103 has a minimum admittance here preventing signals from passing through it. These effects define the high frequency part of the passband. However, increasing the frequency quickly decreases the admittance of the series resonator 101 as it moves to its antiresonant frequency at C (as well as increasing the admittance of the shunt resonator 103). At this frequency, the low admittance of the series resonator 101, in series between the input 105 and the output 107 of the bandpass filter 100, prevents signals from passing through the bandpass filter 100 without being heavily attenuated. This gives rise to the high frequency attenuation region at C.

The cumulative effect of the frequency response both the series resonator 101 and shunt resonator 103 gives rise to the passband of the bandpass filter 100 (line 201). Generally, the width of the passband is determined by the frequency difference between the resonant frequency of the shunt resonator 103, SH $f_s$ (at A), and the antiresonant frequency of the series resonator 101, SE $f_p$ (at C). The closer together these two frequencies, the narrower the passband, and the further apart they are the wider the passband.

Figure 3:
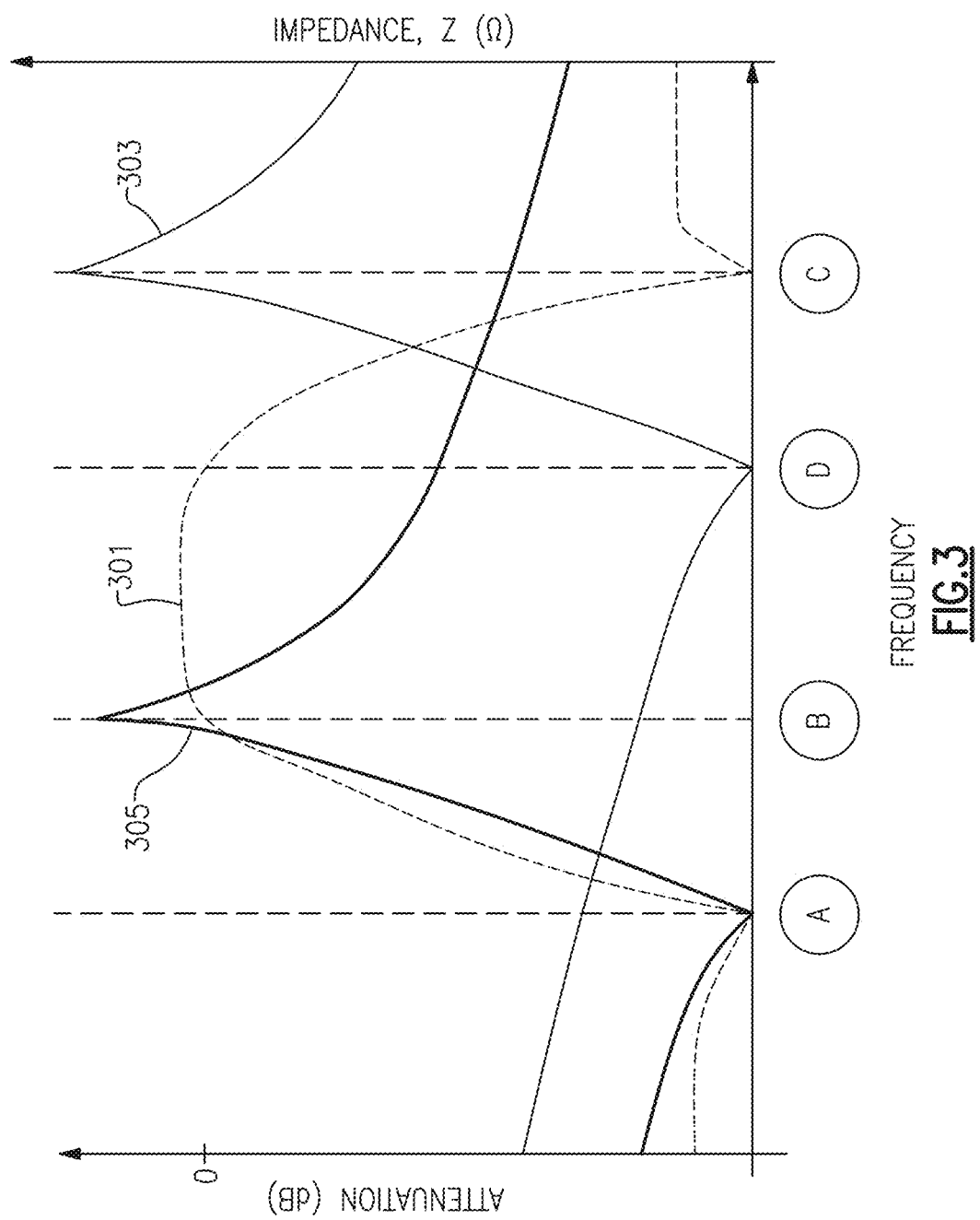
FIG. 3 is a frequency response of a bandpass filter according to an embodiment.

FIG. 3 illustrates the frequency response of another bandpass filter 100 according to FIG. 1. The frequency response is similar to that illustrated in FIG. 2, but with the series and shunt resonators having different resonant and antiresonant frequencies. Another difference between FIG. 3 and FIG. 2 is that whereas FIG. 2 plotted the frequency response of the resonators in terms of their admittance, FIG. 3 shows the frequency response in terms of their impedance. Therefore, as with FIG. 2, in FIG. 3, when considering line 301 representing the bandpass filter 100, a high value means that a signal passing through the bandpass filter 100 is not attenuated and a low value means that a signal is heavily attenuated. On the other hand, unlike FIG. 2, for lines 303 and 305, a high value means that a signal cannot pass through the respective resonator 101, 103, and a low value means that a signal can.

As noted above, a difference between the resonators that correspond to the graph in FIGS. 2 and 3 is that in FIG. 2, the antiresonant frequency of the shunt resonator and the resonant frequency of the series resonator are the same (at B), whereas in FIG. 3 the antiresonant frequency of the shunt resonator and the resonant frequency of the series resonator are different (at B and D respectively). Considering the frequency response of shunt resonator 103, represented by line 305, at low frequencies the impedance decreases until a resonant frequency at A, where the impedance presented by shunt resonator 103 is at a minimum. This resonant frequency is often referred to as series resonance, or $f_s$. Increasing the frequency beyond this resonant frequency causes the impedance of the shunt resonator 103 to quickly increase to a maximum at an antiresonant frequency at B. This antiresonance is often referred to as parallel resonance, or $f_p$. From the antiresonant frequency, the impedance then drops again as frequency is further increased.

The frequency response of the shunt resonator 103 (line 305) gives the bandpass filter 100 the lower edge of the passband (between A and B) and the low frequency attenuation zone (at A). This is because at the resonant frequency of the shunt resonator 103 at A, the shunt resonator 103 presents very little impedance and so the signal is effectively grounded meaning that no signal, or only a heavily attenuated signal, reaches the output 107 when passing through the bandpass filter 100 giving rise to the attenuation region at A. However, at the slightly higher resonant frequency, at B, the impedance of the shunt resonator 103 is at a maximum, thus preventing signals from passing through the shunt resonator 103 and to ground. Accordingly, signals at this frequency pass through the bandpass filter 100 with little or no attenuation, giving rise to the lower portion of the passband.

Considering the frequency response of the series resonator 101 (line 303), it can be seen that the impedance decreases as frequency increases up to a resonant frequency at D, which is higher than the antiresonant frequency of the shunt resonator at B. After the resonant frequency at D, the impedance quickly rises until an antiresonant frequency at C, before decreasing once more. This frequency response gives rise to the high frequency cut-off of the passband (between D and C) and the high frequency attenuation region (at C). At D, because the series resonator 101 here has a very low impedance at its resonant frequency, signals can pass through it with no, or very little, attenuation, and this defines the high frequency part of the passband. However, increasing the frequency quickly increases the impedance of the series resonator 101 as it moves to its antiresonant frequency at C. At this frequency, the large impedance of the series resonator 101, in series between the input 105 and the output 107 of the bandpass filter 100, prevents signals from passing through the bandpass filter 100 without being greatly attenuated. This gives rise to the high frequency attenuation region at C.

Figure 4:
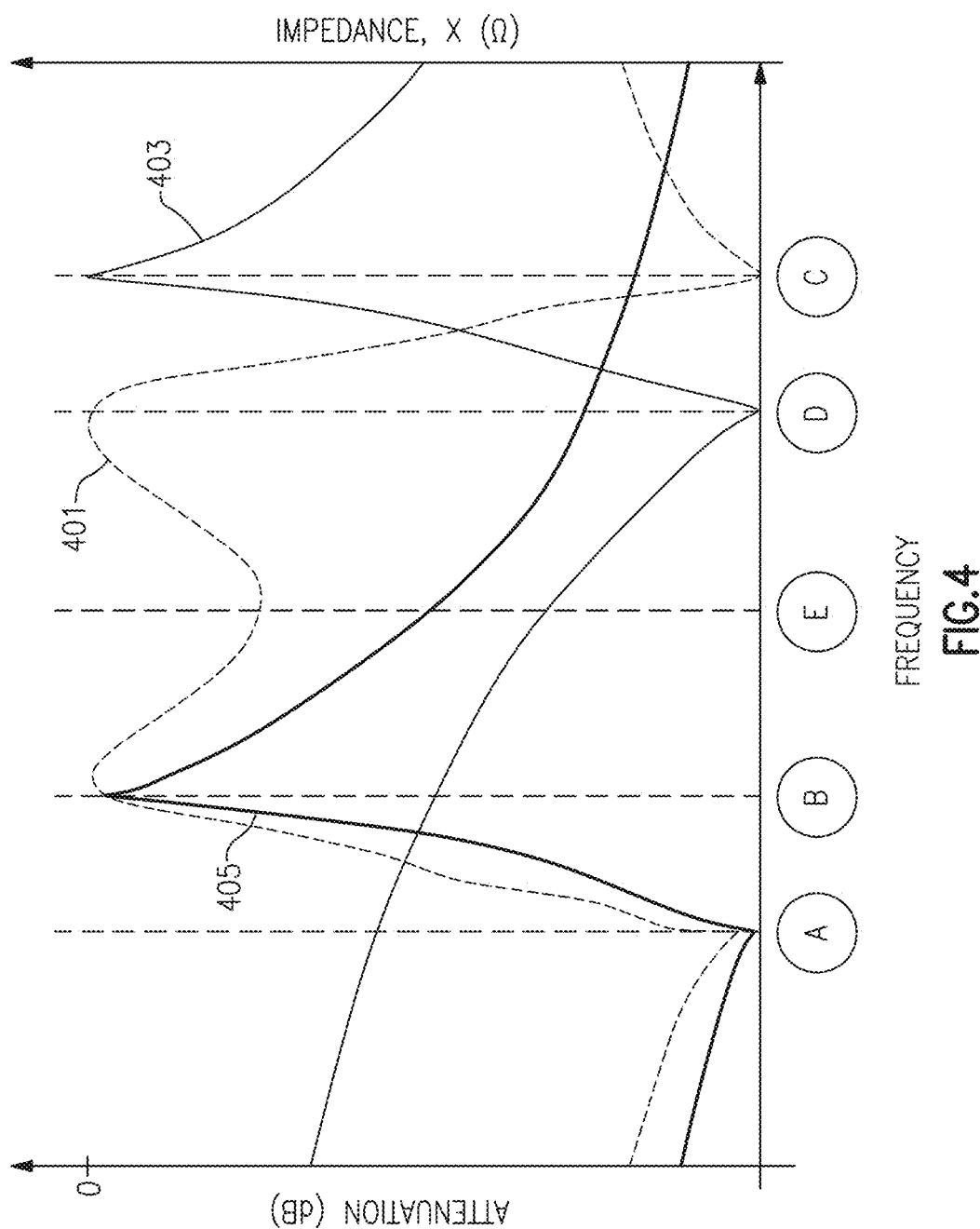
FIG. 4 is a frequency response of a bandpass filter according to an embodiment.

The cumulative effect of the frequency response both the series resonator 101 and shunt resonator 103 gives rise to the frequency response of the passband, in particular between B and C, of the bandpass filter 100 (line 301). Generally, the width of the passband is determined by the frequency difference between the resonant frequency of the shunt resonator 103, SH $f_s$ (at A), and the antiresonant frequency of the series resonator 101, SE $f_p$ (at C). The closer together these two frequencies, the narrower the passband, and the further apart they are the wider the passband. The central region of the passband, between B and D is further defined by the frequency difference between the antiresonant frequency of the shunt resonator, SH $f_p$, and the resonant frequency of the series resonator, SE $f_s$. Again, the closer together these two frequencies, the narrower the passband, and the further apart they are the wider the passband. However, if the two frequencies SH $f_p$ and SE $f_s$ are moved too far apart, the central region of the passband no longer exhibits the desired behavior and does not pass signals at these frequencies as well as at the edges of the passband. FIG. 4 illustrates such an effect.

FIG. 4 illustrates a bandpass filter 100 frequency response similar to that of FIG. 3. However, the antiresonant frequency of the shunt resonator 103 at B, SH $f_p$, and the resonant frequency of the series resonator 101 at D, SE $f_s$, have been moved further apart from each other. That is, there is a larger frequency gap between SH $f_p$ and SE $f_s$ in FIG. 4 than in FIG. 3. This gives rise to a dip in the passband at E, where the impedance of the shunt resonator 103 is relatively low compared to its maximum at SH $f_p$ and the impedance of the series resonator 101 is relatively high compared to its minimum at SE $f_s$. This means that signals at the middle frequencies of the passband pass through the bandpass filter 100 with an increased level of attenuation compared to at the edges of the passband.

Figure 5:
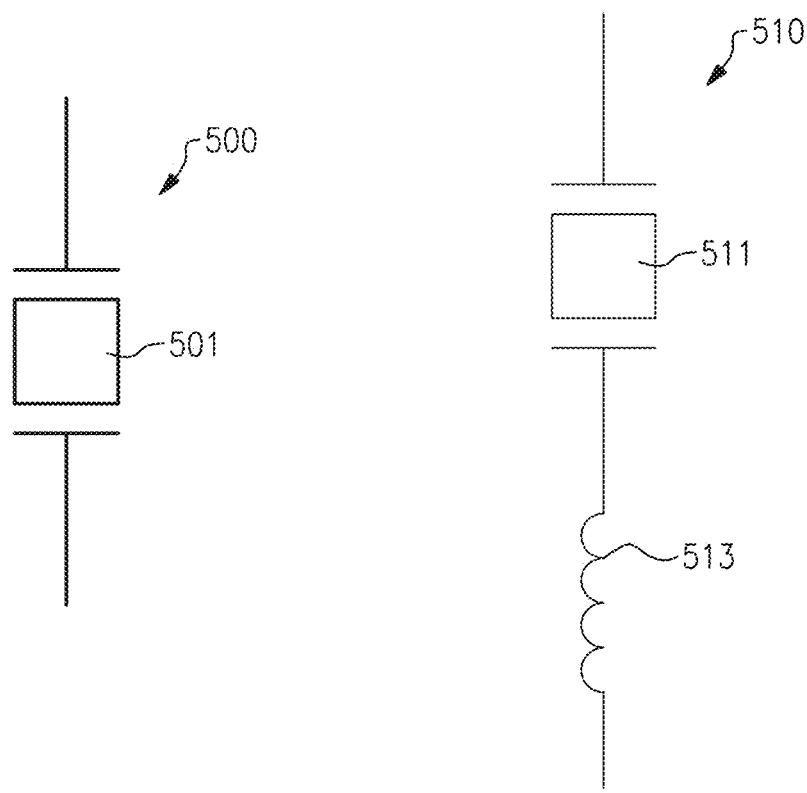
FIG. 5 is a pair of resonator circuits according to an embodiment.
Figure 6:
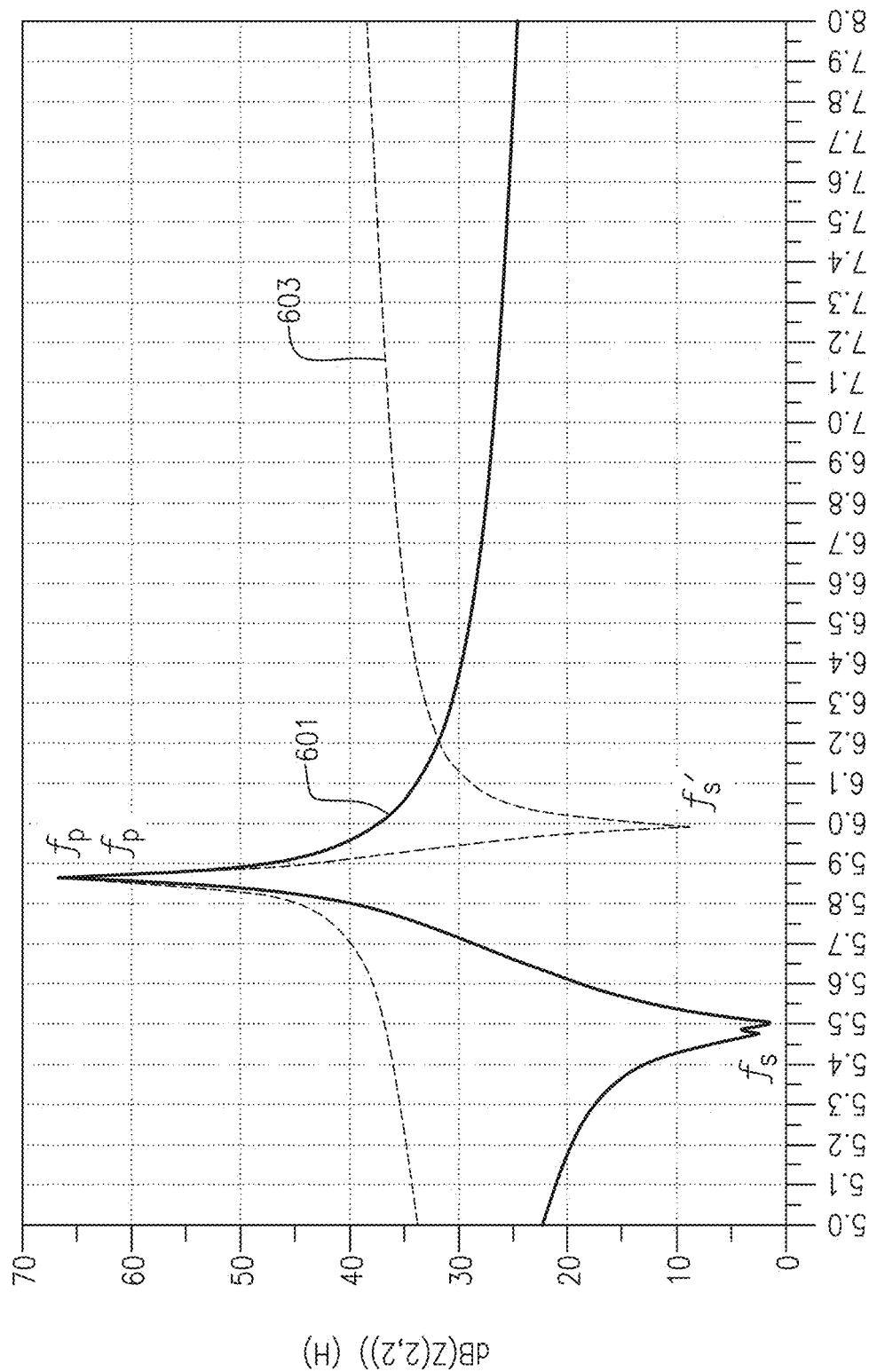
FIG. 6 is a frequency response of the pair of resonator circuits of FIG. 5 according to an embodiment.

Such a problem can be overcome by using a resonator in combination with a reactive component, such as an inductor or a capacitor. FIG. 5 illustrates a first resonator circuit 500 comprising a resonator 501 as well as a second resonator circuit 510 comprising a resonator 511 in series with a reactive component, in this case inductor 513. FIG. 6 illustrates the frequency response of the first resonator circuit 500 and the second resonator circuit 510. It is noted that the resonators 501 and 511 are identical, with resonator circuits 500, 510 only differing due to the presence of inductor 513 in resonator circuit 510.

FIG. 6 plots the impedance of the resonator circuits 500, 510 with frequency. The impedance of resonator circuit 500 is shown by the solid line 601, whereas the impedance of resonator circuit 510 is shown by dashed line 603.

First looking at line 601 showing the impedance of the resonator circuit 500, it can be seen that this is similar in shape to the impedance curves for the series and shunt resonators in FIGS. 3 and 4 (i.e., lines 303, 305 and 403, 405). That is, as frequency increases from the low frequency end of the graph, the impedance drops to a minimum at the resonant frequency $f_s$ of the resonator circuit 500 (at around 5.5 GHz) before increasing rapidly to a maximum at the antiresonant frequency $f_p$ of the resonator circuit 500 (at a little before 5.9 GHz). The impedance then drops and levels off again as the frequency further increases. On the other hand, looking at line 603 reveals that resonator circuit 510 has a different behavior.

The addition of the reactive component in resonator circuit 510, in this case inductor 513, causes a new resonant frequency, labelled $f_s'$, at a frequency above the antiresonant frequency $f_p$. As can be seen, however, the inclusion of inductor 513 does not affect the antiresonant frequency $f_p$, of resonator circuit 510, which is co-located with the antiresonant frequency of the resonator circuit 500. Additionally, whilst a resonant frequency $f_s$ below the antiresonant frequency $f_p$ cannot be seen for line 603, the inclusion of inductor 513 does not remove this resonant frequency but instead moves it to a lower frequency, in this case a frequency lower than the range shown in FIG. 6. Preferably, to achieve this frequency response, the inductor 513 should have a large inductance value such that the new resonant frequency $f_s'$ is located above, but nearby to, the antiresonant frequency $f_p$ and such that resonant frequency $f_s$ is moved to a much lower frequency, as illustrated by line 603.

Figure 7:
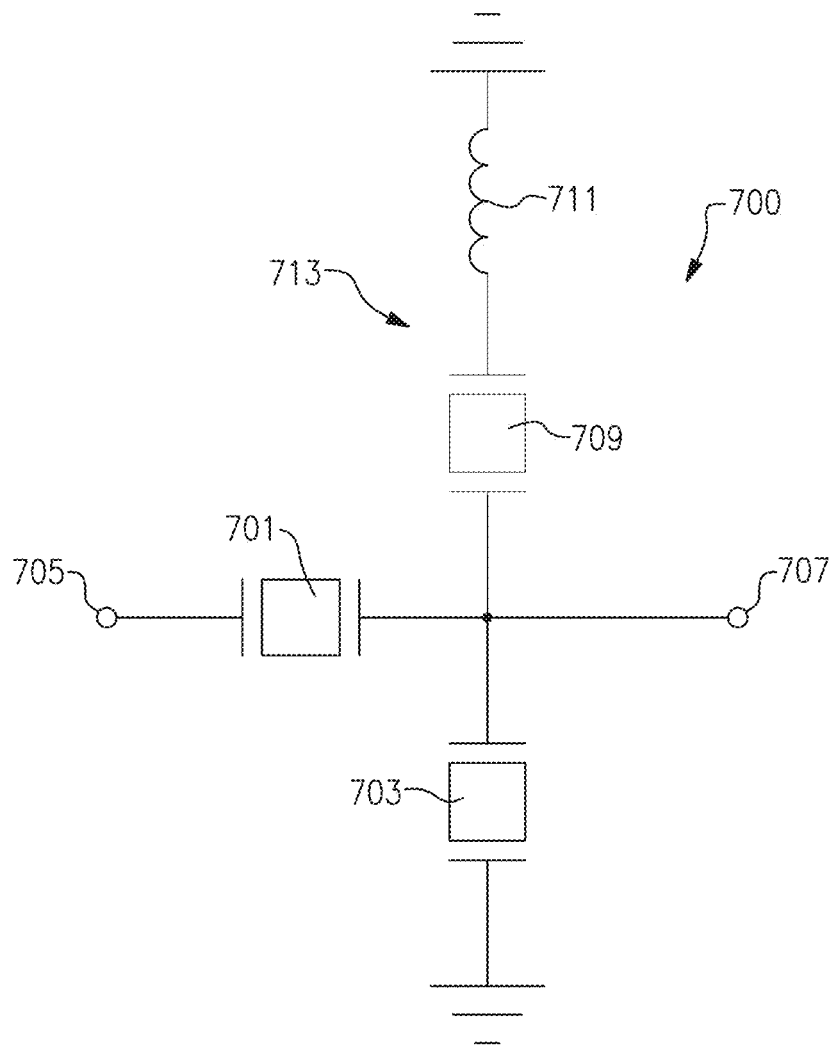
FIG. 7 is a bandpass filter according to according to an embodiment.

A bandpass filter 700 comprising a resonator circuit 713 having a resonator 709 and an inductor 711 is illustrated in FIG. 7. Like the bandpass filter 100 shown in FIG. 1, the bandpass filter 700 of FIG. 7 comprises a series resonator 701 connected between an input 705 and an output 707. The bandpass filter 700 also comprises a first shunt resonator circuit 703 connected in parallel with ground and comprising a resonator. That is, the shunt resonator circuit 703 is connected from between the input 705 and output 707 to ground. Additionally, bandpass filter 700 comprises a second shunt resonator circuit 713 connected in parallel with ground. The second shunt resonator circuit 713 comprises a resonator 709 in series with an inductor 711. The inductor 711 is preferably a large inductor as discussed above.

Figure 8:
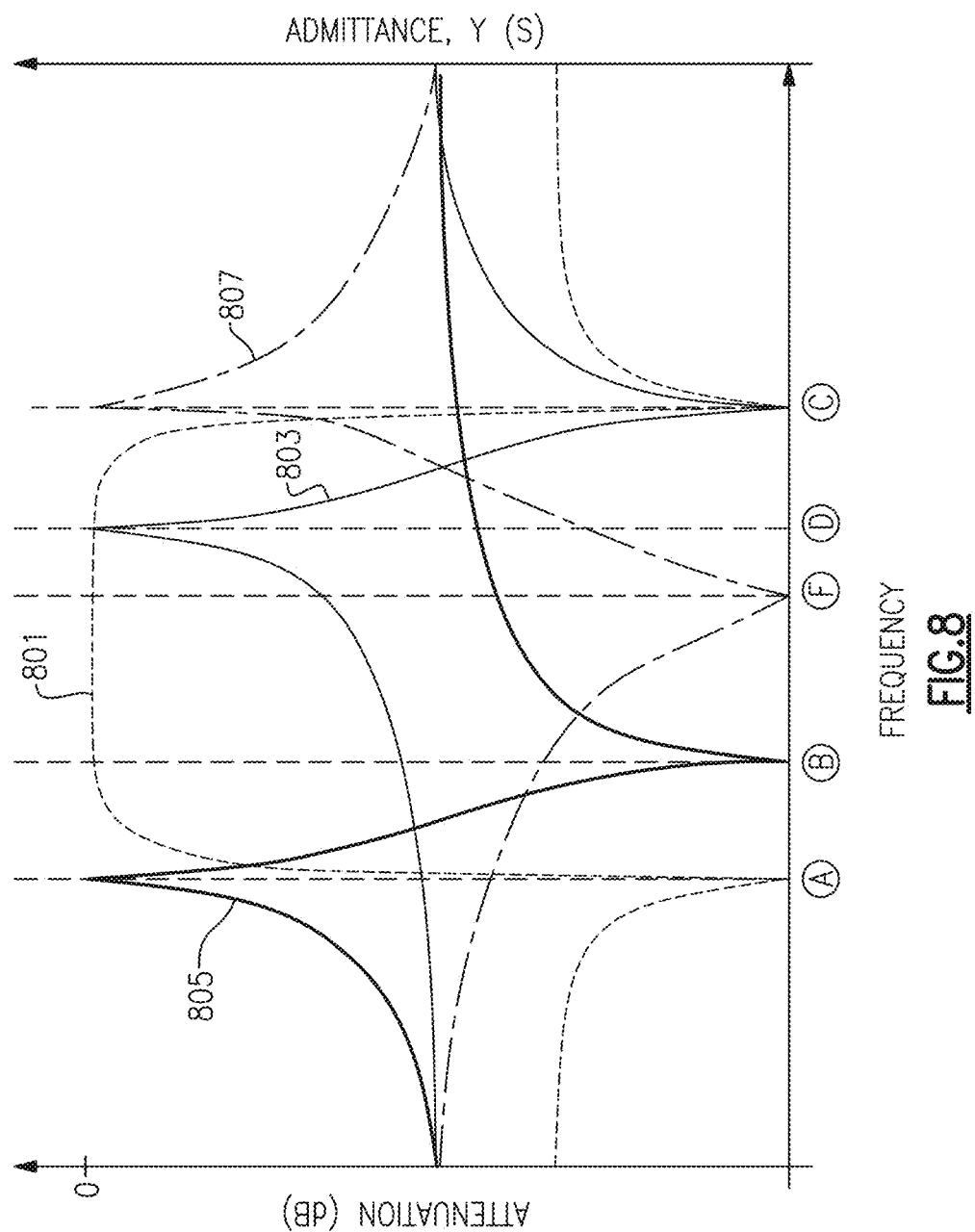
FIG. 8 is a frequency response of a bandpass filter according to an embodiment.

The frequency response of such a bandpass filter 700 is illustrated in FIG. 8. Similarly to FIG. 2, FIG. 8 shows the attenuation of the bandpass filter 700 across different frequencies, as well as the frequency responses of the series resonator 701, the first shunt resonator circuit 703 and the second shunt resonator circuit 713. Dashed line 801 shows the frequency response of the bandpass filter 700, thin line 803 shows the frequency response of the series resonator 701, thick line 805 shows the frequency response of the first shunt resonator circuit 703, and dash-dot line 807 shows the frequency response of the second shunt resonator circuit 713.

Considering line 805, corresponding to the first shunt resonator circuit 703, the resonant frequency at A, $f_s$, grounds the first shunt resonator circuit 703 as described above preventing signals from passing through bandpass filter 700 and giving rise to the low frequency cut-off of the passband and the low frequency attenuation region at A. The antiresonant frequency, $f_p$, of the first shunt resonator circuit 703 is located within the passband, at B, which contributes to the lower frequency region of the passband having low attenuation.

The series resonator 701 contributes to the high frequency region of the passband. Looking at line 803, it can be seen that the resonant frequency, $f_s$, is at D at the upper edge of the passband and then the antiresonant frequency, $f_p$, is at a higher frequency at C in the high frequency attenuation region. Together with the first shunt resonator 703, the series resonator 701 defines the width of the passband of the bandpass filter 700.

However, to ensure that the bandpass filter 700 maintains zero or low attenuation over the whole range of the passband, even when the antiresonant frequency of the first shunt resonator circuit 703 (at B) and the resonant frequency of the series resonator 701 (at D) are relatively far apart, bandpass filter 700 comprises second shunt resonator circuit 713. The frequency response of the second shunt resonator circuit 713 is shown by line 807. Towards the center of the passband, at F the second shunt resonator circuit 713 has its antiresonant frequency which, as described above, prevents signals from passing through it and helps to prevent attenuation by the bandpass filter 700. The resonant new resonant frequency of the second shunt resonator circuit 713 (i.e., $f_s'$ in FIG. 6), is located at C, in line with the antiresonant frequency of the series resonator 701, and contributes to the high frequency cutoff of the passband.

Figure 9:
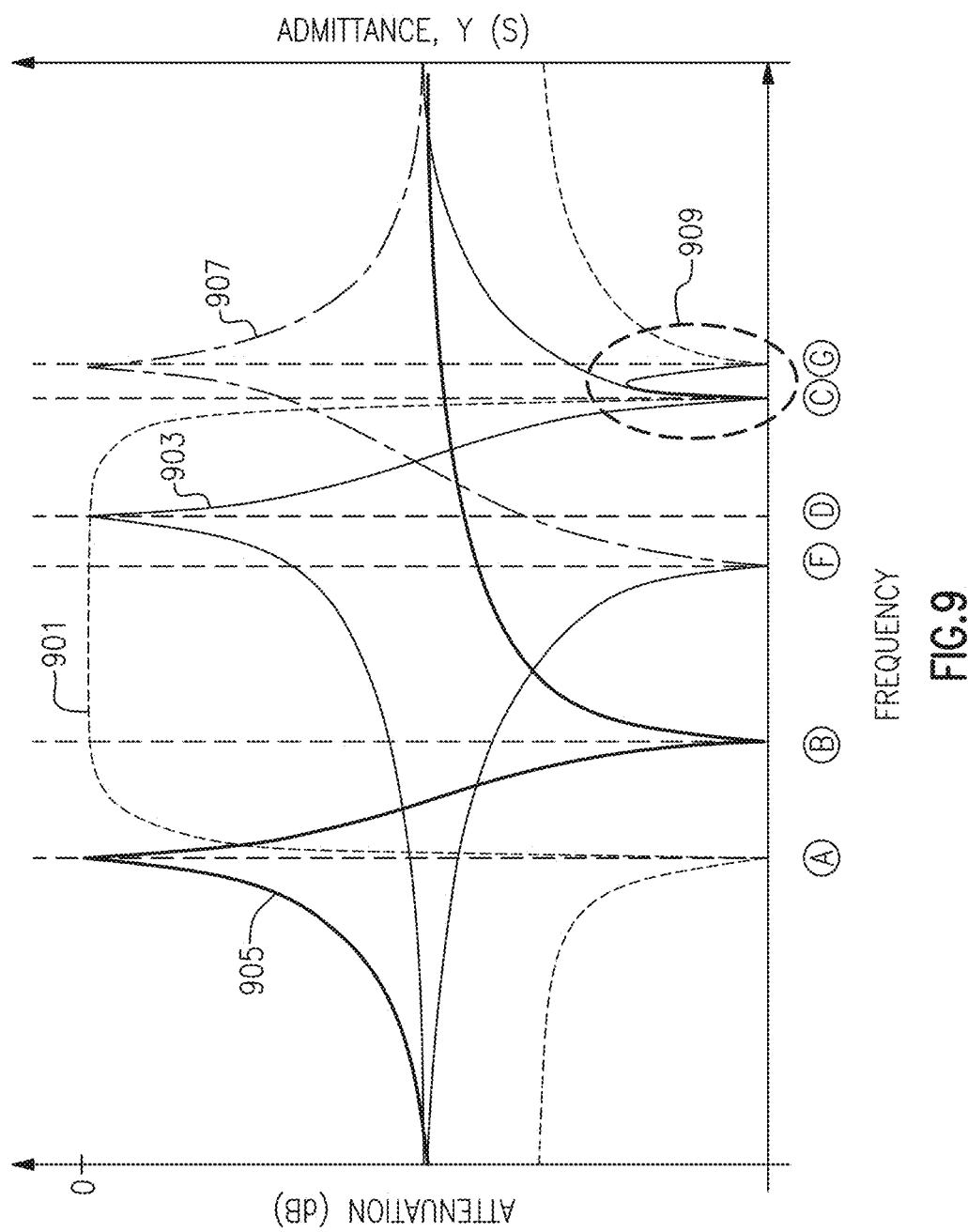
FIG. 9 is a frequency response of a bandpass filter according to an embodiment.

FIG. 9 shows another possible frequency response of the bandpass filter 700 of FIG. 7, depending on the resonator components used. The frequency response of the series resonator 701 (line 903) and the first shunt resonator circuit 703 (line 905) are as described above in relation to FIG. 8. Similarly, the second shunt resonator circuit 713 has its antiresonant frequency at F within the middle region of the passband. However, whereas in FIG. 8 the second shunt resonator circuit 713 has its resonant frequency at G within the passband, in FIG. 9 the resonant frequency of the second shunt resonator circuit 713 at G is outside the passband. In particular, it is at a higher frequency than the resonant frequency of the series resonator 701 at D. Because the second shunt resonator circuit 713 is connected in parallel to ground, at its resonant frequency it can allow signals to pass through it and so it contributes to a second increase in the attenuation at G after that caused by the series resonator 701 at C. This enlarged attenuation region is shown by region 909.

Figure 10:
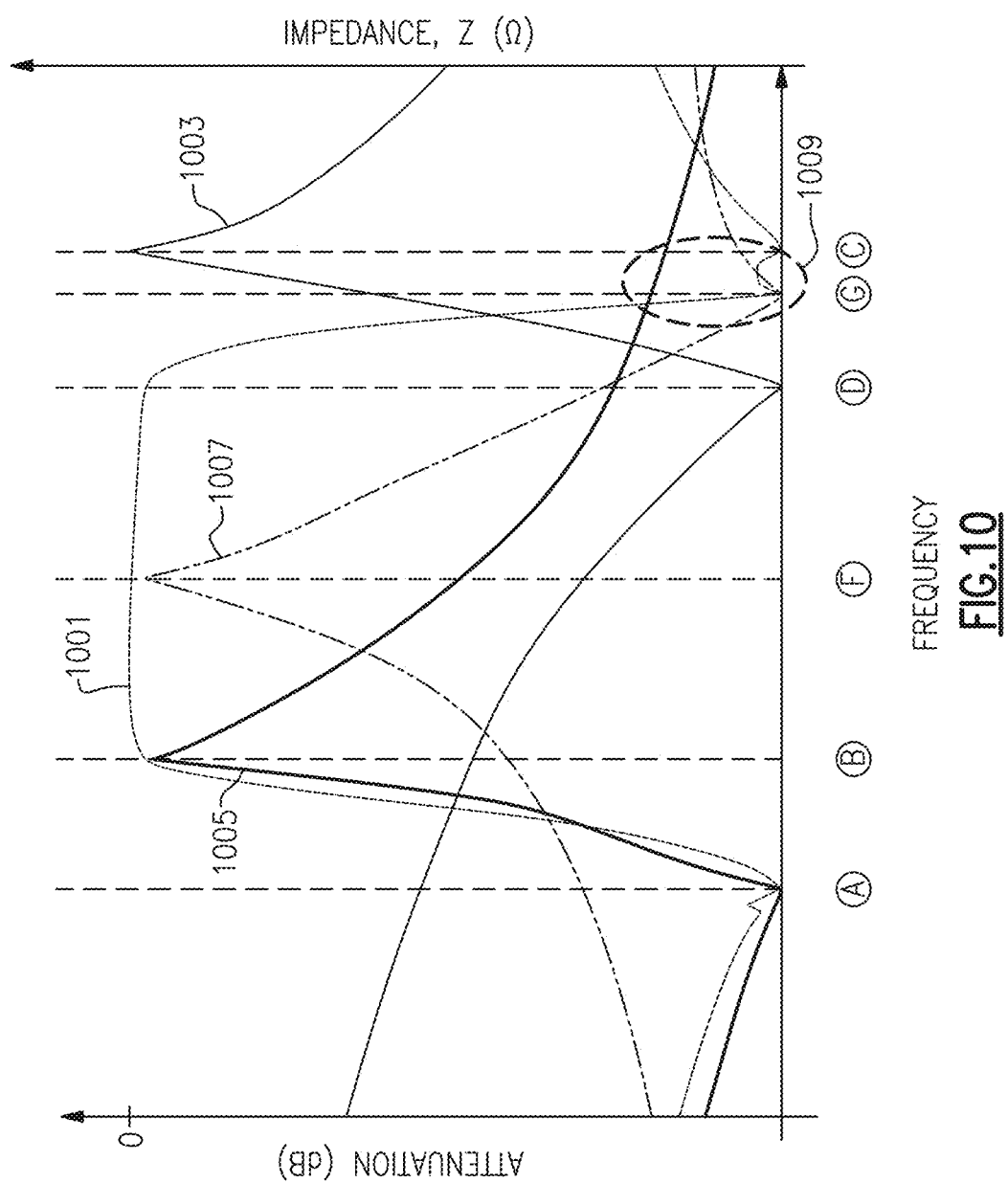
FIG. 10 is a frequency response of a bandpass filter according to according to an embodiment.

FIG. 10 also shows a similar frequency response of a bandpass filter 700 to FIG. 9 (line 1001), though it shows the response of the series resonator 701 (line 1003), the first shunt resonator circuit 703 (line 1005) and the second shunt resonator circuit 713 (line 1007) with respect to the impedance they present, as in FIGS. 3 and 4. However, compared to FIG. 9, C and G are switched. That is, whereas in FIG. 9 the antiresonant frequency of the series resonator 701 at C is a lower frequency than the resonant frequency of the second shunt resonator circuit 713 at G, in FIG. 10 the resonant frequency of the second shunt resonator circuit 713 at G is a lower frequency than the antiresonant frequency of the series resonator 701 at C. Nevertheless, as both the resonance of the second shunt resonator circuit 713 and the antiresonance of the series resonator 701 both contribute to the attenuation of the bandpass filter, an enlarged attenuation region 1009 is again provided, similar to that of FIG. 9.

Furthermore, whilst not shown in FIGS. 8 to 10, the second shunt resonator can also contribute to increasing the attenuation of the bandpass filter 700 below the passband region (beyond the frequencies shown in FIGS. 8 and 10. This is because the amount of attention at low frequencies depends on the amount of inductance and capacitance (i.e., LC) of the components of the bandpass filter. The inclusion of the second shunt resonator circuit 713, which should have large L and C values, therefore can advantageously increase the attenuation of the bandpass filter 700 at lower frequencies.

Figure 11:
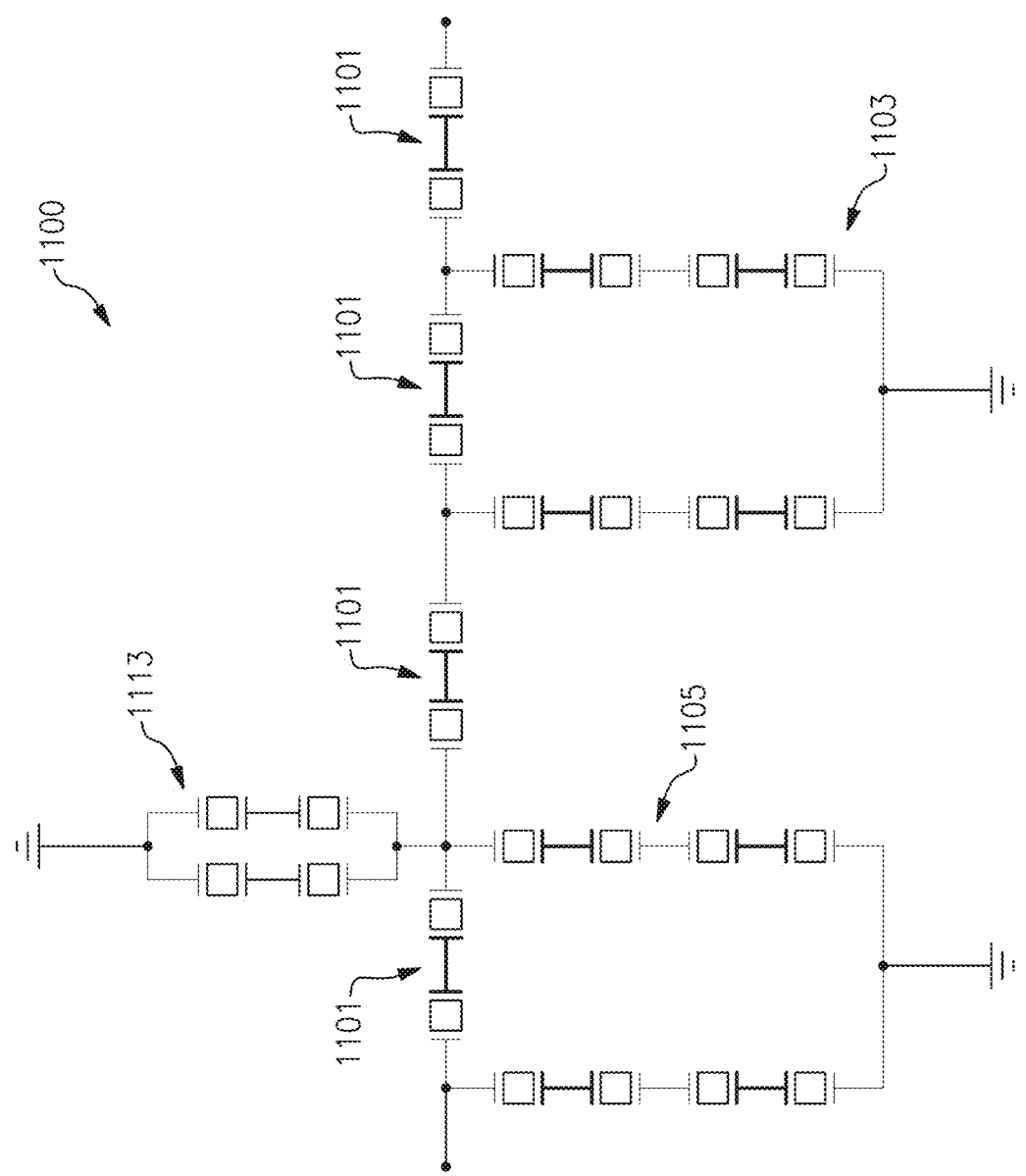
FIG. 11 is a bandpass filter according to according to an embodiment.

Whilst the bandpass filters described above have been shown having a simple arrangement of series and shunt resonators, with only one series resonator and only one resonator in each shunt resonator circuit, it will be appreciated by those skilled in the art that the teachings of the present document can be applied to a wide variety of bandpass filter arrangements. For example, FIG. 11 illustrates a bandpass filter 1100 having a more complicated arrangement of resonators. As can be seen, multiple pairs of series resonators 1101 are shown, and two first shunt resonator circuits 1103, 1105 are shown, each comprising a number of resonators. The second shunt resonator circuit 1113 also comprises a plurality of individual resonators: two pairs of series resonators arranged in parallel. It will be understood that the skilled person will recognize that a number of other techniques and methods known in the art for providing bandpass filters and for altering the properties of bandpass filters can be combined with teaching disclosed herein.

Furthermore, the resonators used with the bandpass filters described above may be any time of suitable resonator, including but not limited to bulk acoustic wave (BAW) resonators and surface acoustic wave (SAW) resonators.

The reactive component in the second shunt resonator circuit of the bandpass filters described herein may comprise any combination of reactive components that gives rise to the desired frequency response as described above. In particular, the reactive component may comprise one or more inductors and/or one or more capacitors arranged in series or parallel with each other and/or the resonator components in the second shunt resonator circuit. Preferably, if the reactive component is an inductor then it is arranged in series with the resonator components, whereas if it is a capacitor then it is arranged in parallel with the resonator components.

Whereas the low frequency resonant frequency of the second shunt resonator circuits in FIGS. 8 to 10 were not shown because they were at a much lower frequency so as to not affect the passband of the bandpass filter, in some cases the low frequency resonant frequency may be at a similar frequency to the resonant frequency of the first shunt resonator circuit. This can give an enlarged attenuation region, similar to enlarged attenuation regions 909 and 1009 caused by the proximity of the antiresonant frequency of the series resonator and the (high frequency) resonant frequency of the second shunt resonator circuit. In some cases, this can be combined with the enlarged attenuation region at higher frequencies described in FIGS. 9 and 10 to provide a bandpass filter having enlarged attenuation regions at both the high and low frequency edges of the passband.

The bandpass filter may also comprise a plurality of second shunt resonator circuits. That is, a plurality of shunt resonator circuits, each comprising one or more resonators and one or more reactive components, may be provided. The effects of these can be cumulative to extend the passband than can be achieved using only one second shunt resonator circuit. Similarly, additional second shunt resonator circuits can also be used to further widen the enlarged attenuation regions either side of the passband, in accordance with the above principles.

Figure 12:
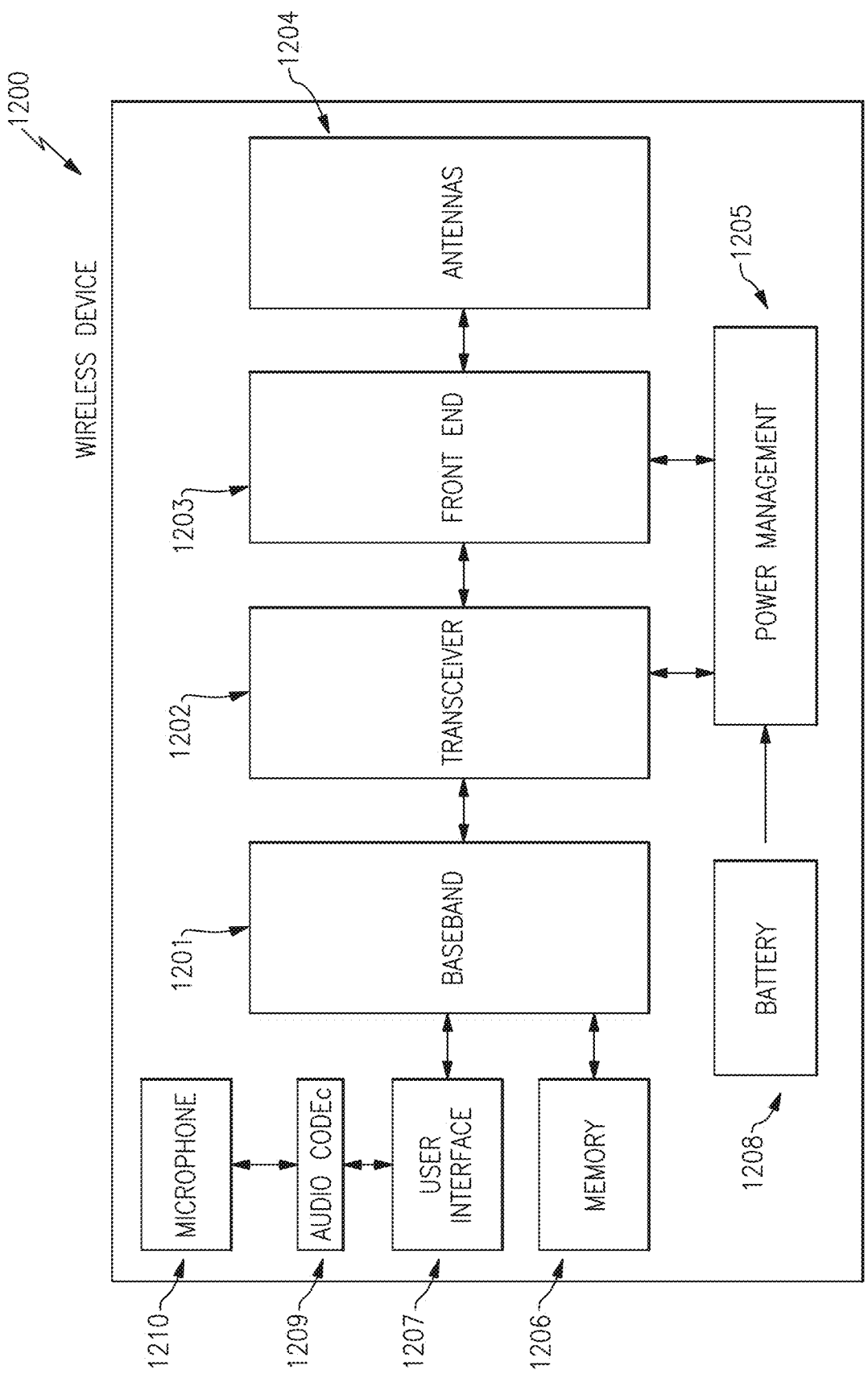
FIG. 12 is a wireless device according to an embodiment.

FIG. 12 is a schematic diagram of a wireless device 1200 that can incorporate aspects of the invention. The wireless device 1200 can be, for example but not limited to, a wireless access point, such as a router, or a portable telecommunication device, such as a mobile cellular-type telephone. The wireless device 1200 can include a microphone arrangement 1200, and may include one or more of a baseband system 1201, a transceiver 1202, a front end system 1203, one or more antennae 1204, a power management system 1205, a memory 1206, a user interface 1207, a battery 1208, and audio codec 1209. The microphone arrangement may supply signals to the audio codec 1209 which may encode analog audio as digital signals or decode digital signals to analog. The audio codec 1209 may transmit the signals to a user interface 1207. The user interface 1207 transmits signals to the baseband system 1201. The transceiver 1202 generates RF signals for transmission and processes incoming RF signals received from the antennae. The front end system 1203 aids in conditioning signals transmitted to and/or received from the antennae 1204. The antennae 1204 can include antennae used for a wide variety of types of communications. For example, the antennae 1204 can include antennae 1204 for transmitting and/or receiving signals associated with a wide variety of frequencies and communications standards. The baseband system 1201 is coupled to the user interface to facilitate processing of various user input and output, such as voice and data. The baseband system 1201 provides the transceiver 1202 with digital representations of transmit signals, which the transceiver 1202 processes to generate RF signals for transmission. The baseband system 1201 also processes digital representations of received signals provided by the transceiver 1202.

As shown in FIG. 12, the baseband system 1201 is coupled to the memory 1206 to facilitate operation of the wireless device 1200. The memory 1206 can be used for a wide variety of purposes, such as storing data and/or instructions to facilitate the operation of the wireless device 1200 and/or to provide storage of user information. The power management system 1205 provides a number of power management functions of the wireless device 1200. The power management system 1205 receives a battery voltage from the battery 1208. The battery 1208 can be any suitable battery for use in the wireless device, including, for example, a lithium-ion battery. In other cases, however, the battery 1208 may instead be replaced by a mains electricity connection.

The bandpass filters described herein in accordance with one or more embodiments of the invention may be incorporated into the wireless device 1200 of FIG. 12. For example, the bandpass filters may be incorporated into aspects of the front end system 1203, e.g., connected to an antenna switch module (ASM) in the front end system 1203 defining the different bands that can be selected by the ASM.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A bandpass filter comprising:
   a series resonator circuit disposed between an input and an output of the bandpass filter;
   a first shunt resonator circuit electrically connected to the series resonator circuit and to ground; and
   a second shunt resonator circuit electrically connected to the series resonator circuit and to ground, the second shunt resonator circuit configured to have one or more frequency pairs with an antiresonant frequency and a first resonant frequency, for at least one frequency pair the antiresonant frequency is within a passband of the bandpass filter and the first resonant frequency at a higher frequency than the antiresonant frequency.

2. The bandpass filter of claim 1 wherein the passband of the bandpass filter is defined between a resonant frequency of the first shunt resonator circuit and an antiresonant frequency of the series resonator circuit.

3. The bandpass filter of claim 2 wherein one or more resonant frequencies of the one or more frequency pairs is at a substantially similar frequency to a high frequency cut-off of the passband.

4. The bandpass filter of claim 3 wherein the one or more resonant frequencies at a substantially similar frequency to a high frequency cut-off of the passband is at a slightly higher or a slightly lower frequency than the antiresonant frequency of the series resonator circuit such that a width of an attenuation region at the high frequency cut-off is increased.

5. The bandpass filter of claim 2 wherein the second shunt resonator circuit is further configured to have one or more second resonant frequencies, each of the one or more second resonant frequencies corresponding to the one or more frequency pairs and at a lower frequency than the antiresonant frequency of the corresponding one or more frequency pairs, and the one or more of the second resonant frequencies are at a much lower frequency than a low frequency cut-off of the passband.

6. The bandpass filter of claim 2 wherein the second shunt resonator circuit is further configured to have one or more second resonant frequencies, each of the one or more second resonant frequencies corresponding to the one or more frequency pairs and at a lower frequency than the antiresonant frequency of corresponding one or more frequency pairs, and the one or more second resonant frequencies are at a substantially similar frequency to a low frequency cut-off of the passband.

7. The bandpass filter of claim 6 wherein the one or more second resonant frequencies of the second shunt resonator circuit at a substantially similar frequency to a low frequency cut-off of the passband are at a slightly higher or a slightly lower frequency than the resonant frequency of the first shunt resonator circuit such that a width of an attenuation region at the low frequency cut-off is increased.

8. The bandpass filter of claim 1 wherein one or more antiresonant frequencies of the second shunt resonator circuit are higher than a resonant frequency of the series resonator circuit.

9. The bandpass filter of claim 1 wherein one or more antiresonant frequencies of the second shunt resonator circuit are lower than a resonant frequency of the series resonator circuit.

10. The bandpass filter of claim 1 wherein the second shunt resonator circuit comprises one or more resonators and one or more reactive components, each of the one or more resonators corresponding to one of the one or more frequency pairs.

11. The bandpass filter of claim 10 wherein the one or more reactive components comprise an inductor in series with the one or more resonators.

12. The bandpass filter of claim 11 wherein the inductor has a large inductance value such that for each frequency pair of the second shunt resonator circuit the antiresonant frequency is within the passband of the bandpass filter and the first resonant frequency is at a higher frequency than the antiresonant frequency.

13. The bandpass filter of claim 10 wherein the one or more reactive components comprise a capacitor in parallel with the one or more resonators.

14. The bandpass filter of claim 13 wherein a capacitance of the capacitor is higher than the capacitance of the one or more resonators.

15. The bandpass filter of claim 1 wherein the series resonator circuit comprises a plurality of resonators in series, in parallel, or both.

16. The bandpass filter of claim 1 wherein the first shunt resonator circuit comprises a plurality of resonators in series, in parallel, or both.

17. The bandpass filter of claim 1 wherein any or all of the series resonator circuit, the first shunt resonator circuit, and the second shunt resonator circuit comprise bulk acoustic wave resonators.

18. The bandpass filter of claim 1 wherein any or all of the series resonator circuit, the first shunt resonator circuit, and the second shunt resonator circuit comprise surface acoustic wave resonators.

19. A radiofrequency module comprising:
    a bandpass filter, the bandpass filter having a series resonator circuit disposed between an input and an output of the bandpass filter;
    a first shunt resonator circuit electrically connected to the series resonator circuit and to ground; and
    a second shunt resonator circuit electrically connected to the series resonator circuit and to ground, the second shunt resonator circuit configured to one or more first resonant frequency pairs with at least an antiresonant frequency and a resonant frequency, for at least one frequency pair an antiresonant frequency is within a passband of the bandpass filter and a resonant frequency is at a higher frequency than an antiresonant frequency.

20. A wireless device comprising:
    a bandpass filter, the bandpass filter having a series resonator circuit disposed between an input and an output of the bandpass filter;
    a first shunt resonator circuit electrically connected to the series resonator circuit and to ground; and
    a second shunt resonator circuit electrically connected to the series resonator circuit and to ground, the second shunt resonator circuit having one or more one or more resonant frequency pairs with at least an antiresonant frequency and a first resonant frequency, for at least one frequency pair, an antiresonant frequency is within a passband of the bandpass filter and a resonant frequency is at a higher frequency than the antiresonant frequency.

* * * * *